(12) United States Patent
Gris

(10) Patent No.: US 6,806,536 B2
(45) Date of Patent: Oct. 19, 2004

(54) MULTIPLE-FUNCTION ELECTRONIC CHIP

(75) Inventor: Yvon Gris, Tullins (FR)

(73) Assignee: STMicroelectronics S.A., Montrouge (FR)

( * ) Notice: Subject to any disclaimer, the term of this patent is extended or adjusted under 35 U.S.C. 154(b) by 52 days.

(21) Appl. No.: 09/999,208

(22) Filed: Nov. 30, 2001

(65) Prior Publication Data

US 2002/0110952 A1 Aug. 15, 2002

(30) Foreign Application Priority Data

Nov. 30, 2000 (FR) .......................................... 00 15524

(51) Int. Cl.[7] .............................................. H01L 27/02
(52) U.S. Cl. ........................ 257/343; 257/401; 257/350
(58) Field of Search ................................ 257/343, 350, 257/401, 352, 358

(56) References Cited

U.S. PATENT DOCUMENTS

| | | |
|---|---|---|
| 5,477,065 A | 12/1995 | Nakagawa et al. |
| 5,714,782 A | 2/1998 | Nakagawa et al. |
| 5,824,186 A | 10/1998 | Smith et al. |
| 5,909,052 A | 6/1999 | Ohta et al. |
| 5,994,739 A | 11/1999 | Nakagawa et al. |
| 6,362,012 B1 * | 3/2002 | Chi et al. ...................... 438/3 |

OTHER PUBLICATIONS

French Search Report from French Patent Application No. 00 15524, filed Nov. 30, 2000.

* cited by examiner

*Primary Examiner*—Anh Phung
*Assistant Examiner*—Brad Smith
(74) *Attorney, Agent, or Firm*—Lisa K. Jorgenson; James H. Morris; Wolf, Greenfield & Sacks, P.C.

(57) ABSTRACT

An electronic chip formed of at least one second elementary chip set in first elementary chip so that the surfaces of the elementary chips are substantially in the same plane wherein the first elementary chip is formed of a heterogeneous substrate including a surface layer above a layer of different doping and defining at least one cavity extending the entire thickness of the second layer and at least one metal interconnection level connecting the at least one second elementary chip to the first elementary chip.

26 Claims, 6 Drawing Sheets

MULTIPLE-FUNCTION ELECTRONIC CHIP

BACKGROUND OF THE INVENTION

1. Field of the Invention

The present invention relates to the field of microelectronics.

The present invention more specifically relates to forming composite electronic chips that perform many functions of various types.

2. Discussion of the Related Art

An electronic system is formed of one or several electronic boards. Each board implements a set of functions, and for this purpose, it includes passive elements, hybrid circuits, and integrated circuits. An integrated circuit is formed of an electronic chip assembled on a support or in a package.

Integrating the functionalities of an electronic board in the same integrated circuit especially enables:

- reducing the cost, since several thousands of chips are collectively formed on a same wafer;
- increasing speed and reducing power consumption, since unwanted elements between the various functions are minimized within the same integrated circuit; and
- increasing the reliability for all of these functions, since they are included in a single circuit.

However, all functionalities of an electronic board are not always simultaneously integrable in the same integrated circuit. Such is the case when the integration of one function block requires use of a first substrate type and the integration of another function block requires use of a second substrate type.

As an example, reference will be made to the case of a GSM portable phone. In such a phone, there is a radiofrequency portion, a block that processes intermediary frequencies, and an analog (baseband) signal processing. Other function blocks are also present. These blocks are, in particular, radio amplifiers, memories, and management and regulation of power supplies. Secondary elements such as a calculator may belong to the system.

Technological methods using a massive silicon substrate as in BICMOS processes (U.S. Pat. No. 5,953,600 which is incorporated herein by reference) enable integration on the same electronic chip of:

- bipolar components operating at several gigahertz;
- MOS transistors for complex digital and analog circuits;
- active and passive components that form an electronic memory; and
- power components.

However, these processes that use a bulk silicon substrate do not enable integration, with optimal electric characteristics, of passive components such as capacitors, resistors, and inductances.

The degradation of the characteristics of these passive components is caused by the presence of the substrate, which behaves like a ground plane having a high internal resistance. It creates capacitive and electromagnetic couplings over any component located close to it. In the case of radiofrequency applications, eddy currents are generated in the silicon substrate. These capacitive and electromagnetic couplings cannot be precisely calculated. Accordingly, a massive silicon substrate has a non-predictable effect on the passive components and, accordingly, on the integrated function blocks. For operating frequencies of several gigahertz, these effects may be redhibitory.

In the previously-mentioned example of a portable phone made with a BICMOS method, the specific cases of the resistance and of the inductance are now considered.

In a BICMOS process, resistors are used to bias the quiescent point of bipolar transistors. Such is the case, in particular, for the stages of radiofrequency signal amplification. The D.C. biasing current must be greater than a minimum value. The hazards of the used manufacturing process create an uncertainty about the value of the resistance to be obtained at the end of the manufacturing cycle. It is necessary to increase the average quiescent current to be sure to always be greater than the minimum quiescent current necessary to the proper circuit operation. Any uncertainty, due to the manufacturing process, concerning the value of the resistance to be obtained at the end of the process that causes a useless increase of the power consumption of the circuit. The operating autonomy of a portable phone is an essential feature. The manufacturing method must be able to form precision resistors.

These resistors also conduct an A.C. signal having a frequency of several gigahertz. The unwanted elements of the resistor, mainly the stray capacitance with respect to the substrate, must also be as small as possible.

The methods using a massive silicon substrate enable forming either single-crystal silicon resistors in the substrate or polysilicon resistors above a thick oxide layer. The value of a silicon resistor depends on the amount of active dopants and on the mobility of the carriers in the silicon layer. These two parameters are better controlled when the resistor is made of single-crystal silicon rather than polysilicon. For an industrial process, the reproducibility of resistors formed in single-crystal silicon is of 5%, while that of polysilicon resistors is 20%.

For a method using a massive silicon substrate, the single-crystal silicon resistors are formed in the silicon substrate and isolated therefrom by a junction. This junction has too high a junction capacitance for radiofrequency applications. It is then preferred, to the detriment of the power consumption of the system, to make the resistors in polysilicon despite the lack of reproducibility.

It would be desirable, for reducing the imprecision of the resistors, to use single-crystal silicon on insulator resistors. However, this is not practical with current methods of integrated circuit manufacturing on massive silicon.

The charge impedance of the transistors operating in radiofrequency ranges is often formed of an inductance. Since the frequencies are high, the value of this inductance is small, which makes it integrable. Practically, one or several spirals defined in a metal level are formed to obtain a value of the inductance of approximately 10 nH. The unwanted elements of this inductance then are:

- the spiral resistance;
- the different stray capacitances associated with the inductance, such as:
  - the capacitances between the spirals;
  - the coupling capacitances with the substrate;
- the electromagnetic coupling with the substrate.

Either thick aluminum or copper, which have a low resistance, are used to form such inductances. These two metals, with the thicknesses used, are generally not available in the environment of current manufacturing methods. Further, copper is very contaminating for integrated active components. This makes the implementation of technological processes integrating these components expensive.

If the substrate is massive silicon, there exists a strong coupling between the electromagnetic field generated by the inductance and the conductive silicon of the substrate. The penetration depth of the electromagnetic field into the substrate ranges between 50 and 100 μm for a substrate having a resistivity greater than 5 ohm.cm and for frequencies of a few gigahertz.

The electromagnetic coupling and the various unwanted elements mentioned hereabove degrade the quality factor of the inductance. This quality factor does not exceed 10 for inductances formed on a massive silicon substrate. It would increase to 40 for inductances formed above an insulator having a minimum thickness of 50 μm by using a metal level of low resistance. This type of inductance cannot be formed in a manufacturing method using a bulk silicon substrate.

The integration of all components of a system, such as a portable phone, in a single integrated circuit requires compromises which result in an increase of power consumption and in performance losses. Some passive elements, in particular inductances, must be placed outside of the package containing the chip.

Another solution is the forming of a hybrid circuit including several chips, some at least of the chips being other than on bulk silicon to optimize the desired performances. In this case, it should be noted that:

the performances obtained with a hybrid circuit are a trade-off between those of the electronic board and those which could have been obtained with a single integrated circuit;

the cost is high since the hybridization is performed by handling each chip separately;

the performances are average, since the general bulk is high and there remain many unwanted elements; and the reliability of the assembly depends on the mechanical quality of the components and on the quality of the various connections or weldings performed in the hybridization. This reliability is much lower than that of an integrated circuit.

An assembly of a plurality of chips is disclosed in the European patent application 0465227 but such an assembly raises problems to have the upper surfaces of the various chips exactly at the same level.

SUMMARY OF THE INVENTION

An object of the present invention is to provide a technique enabling implementation, within a same chip, of electronic functions requiring different substrates for their integration.

Another object of the present invention is to combine a method enabling forming passive components optimized for frequencies greater than several gigahertz with a technological process using bulk silicon.

A third object of the present invention is to provide a method enabling forming of electronic chips having the following features:

a lower cost then that obtained with hybrid techniques;

a reliability similar to that of a standard integrated circuit; and maximum electric performances.

To achieve these and other objects, the present invention provides an electronic system integrated in a chip formed of a first elementary chip in which is set at least one second elementary chip so that the surfaces of the elementary chips are substantially in a same plane, said at least one second elementary chip being connected to the first elementary chip by at least one metal interconnection level.

According to an embodiment of the present invention, the electronic system is adapted to a portable phone and includes, in the second elementary chip, passive radiofrequency elements.

The present invention also provides an electronic chip formed of at least one second elementary chip set in a first elementary chip so that the surfaces of the elementary chips are substantially in a same plane, said at least one second elementary chip being connected to the first elementary chip by at least one metal interconnection level.

According to an embodiment of the present invention, the surfaces of the elementary chips forming the electronic chip exhibit level differences smaller than 10 micrometers.

According to an embodiment of the present invention, the second elementary chip is formed by using a sapphire substrate and the first elementary chip is formed by using a massive silicon substrate.

According to an embodiment of the present invention, the first elementary chip is formed in a heterogeneous substrate including a surface layer above a layer of different doping; and at least one cavity is dug into the entire thickness of the surface layer.

According to an embodiment of the present invention, the first elementary chip or said at least one second elementary chip includes at least one pad of dimensions at least equal to 10 μm, used as a contact surface for the metal level interconnecting the first elementary chip to said at least one second elementary chip.

According to an embodiment of the present invention, one of the elementary chips includes a contaminating material connected to the metal interconnection level via a metal level formed before the contaminating material level.

The present invention also provides a method for setting a second elementary chip into a first elementary chip, including the steps of:

forming a first elementary chip on a wafer;

forming at least one cavity in the first elementary chip;

forming and cutting at least one second elementary chip having a height substantially equal to the depth of said cavity;

placing said at least one second elementary chip into said at least one cavity;

depositing an insulating layer; and forming at least one metal interconnection level between the first elementary chip and said at least one second elementary chip.

According to an embodiment of the present invention, the substrate used to form the first elementary chip includes a first heavily-doped layer; the substrate used to form the first elementary chip includes a second layer of different doping; and the etch selectivity or an optical property between the second and the first layer is used to adjust the depth of the cavities dug into the substrate of the first elementary chip.

According to an embodiment of the present invention, first interconnection pads are formed on the first elementary chip; second interconnection pads are formed on said at least one second elementary chip; and a metal level defined by photolithography connects first and second interconnection pads.

According to an embodiment of the present invention, the interconnection pads of one of the elementary chips have dimensions greater than the possible lateral misalignment resulting from the setting of the second elementary chip into the first one.

According to an embodiment of the present invention, a second elementary chip is formed by using a silicon-on-sapphire technology and it includes inductances made in copper.

According to an embodiment of the present invention, a second elementary chip is formed by using a silicon-on-insulator technique and it includes resistors formed in single-crystal silicon.

According to an embodiment of the present invention, after creation of the cavities, a barrier layer is deposited on the wafer to cover the sides of the cavity.

According to an embodiment of the present invention, the first elementary chip is formed on a massive silicon substrate; and said at least one second elementary chip includes passive elements used in radiofrequency.

The foregoing objects, features, and advantages of the present invention, will be discussed in detail in the following non-limiting description of specific embodiments in connection with the accompanying drawings.

BRIEF DESCRIPTION OF THE DRAWINGS

FIGS. 3 to 6 show, according to a specific embodiment of the present invention, the manufacturing of a wafer including chips using two types of substrate; and.

DETAILED DESCRIPTION

In the different drawings, homologous elements are designated with same references. Further, as usual in the representation of integrated circuits, the various drawings are not to scale.

Figure 1:
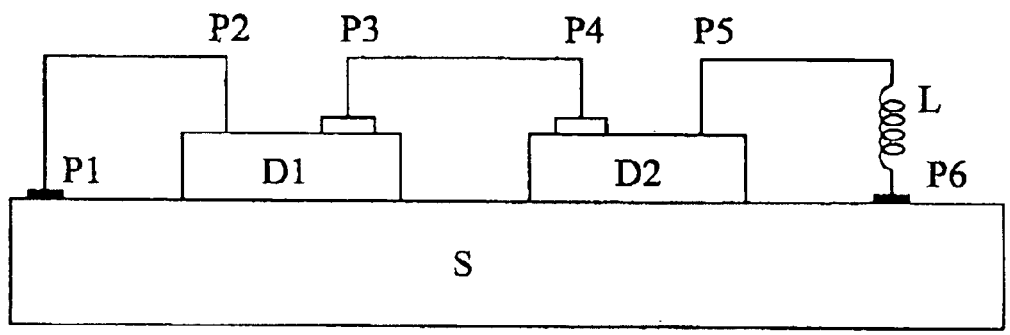
FIG. 1 shows a hybrid assembly of two electronic chips according to prior art.

FIG. 1 shows a hybrid circuit according to prior art. A hybrid circuit is a first approach for the integration of the functions of an electronic board. This approach enables associating, in the same unit, several chips formed on different types of substrates, as well as non-integrated passive elements. For example, FIG. 1 shows a hybrid assembly of two chips D1 and D2. The two chips are glued on a support S made of a ceramic material. Support S supports conductive metal tracks and passive elements such as capacitors, resistors, or inductances. Welded gold wires form connections between pads P1 of support S and pads P2 of the chips. It is also possible to directly interconnect the chips due to pads P3 and P4 respectively formed on chips D1 and D2. When necessary, conductive wires a few millimeters long create inductances L. As an example, such an inductance is shown on FIG. 1 between a pad P5 of chip D2 and a pad P6 of support S. Support S and the elements thus associated are then altogether used as an independent unit. This unit enables assembly of electronic chips formed on different substrates. These substrates are, for example, bulk silicon, gallium arsenide (AsGa), silicon on insulator (SOI).

Figure 2:
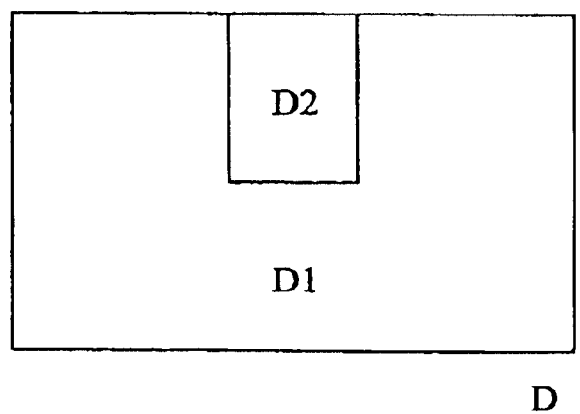
FIG. 2 is a cross-section view illustrating an assembly of electronic chips.

As illustrated in FIG. 2, two chips D1 and D2 are integrated in a single chip D. Chips D1 are formed on a substrate of a first type. Within each chip D1, by using photolithography methods, a cavity is formed. Chips D2 are formed on a substrate of a second type. Chips D2 are cut up. Chips D2 have the size of the cavities formed in chips D1. In particular, the thickness of chips D2 is equal to the cavity depth. This can be obtained either by using a substrate of adequate thickness for the manufacturing of chips D2, or by grinding, at the end of the manufacturing process, the wafers supporting chips D2 to adjust them to the desired thickness. Chips D2 are then placed in the cavities formed for this purpose in chips D1. The resulting wafer thus includes the first and the second type of substrate. Then, the interconnections of chips D1 with chips D2 are formed by standard methods of conductive layer deposition and photolithography. A problem of such a structure is that it is not possible to assert with a high precision that the upper surfaces of chips D1 and D2 are exactly at the same level.

Figure 3:
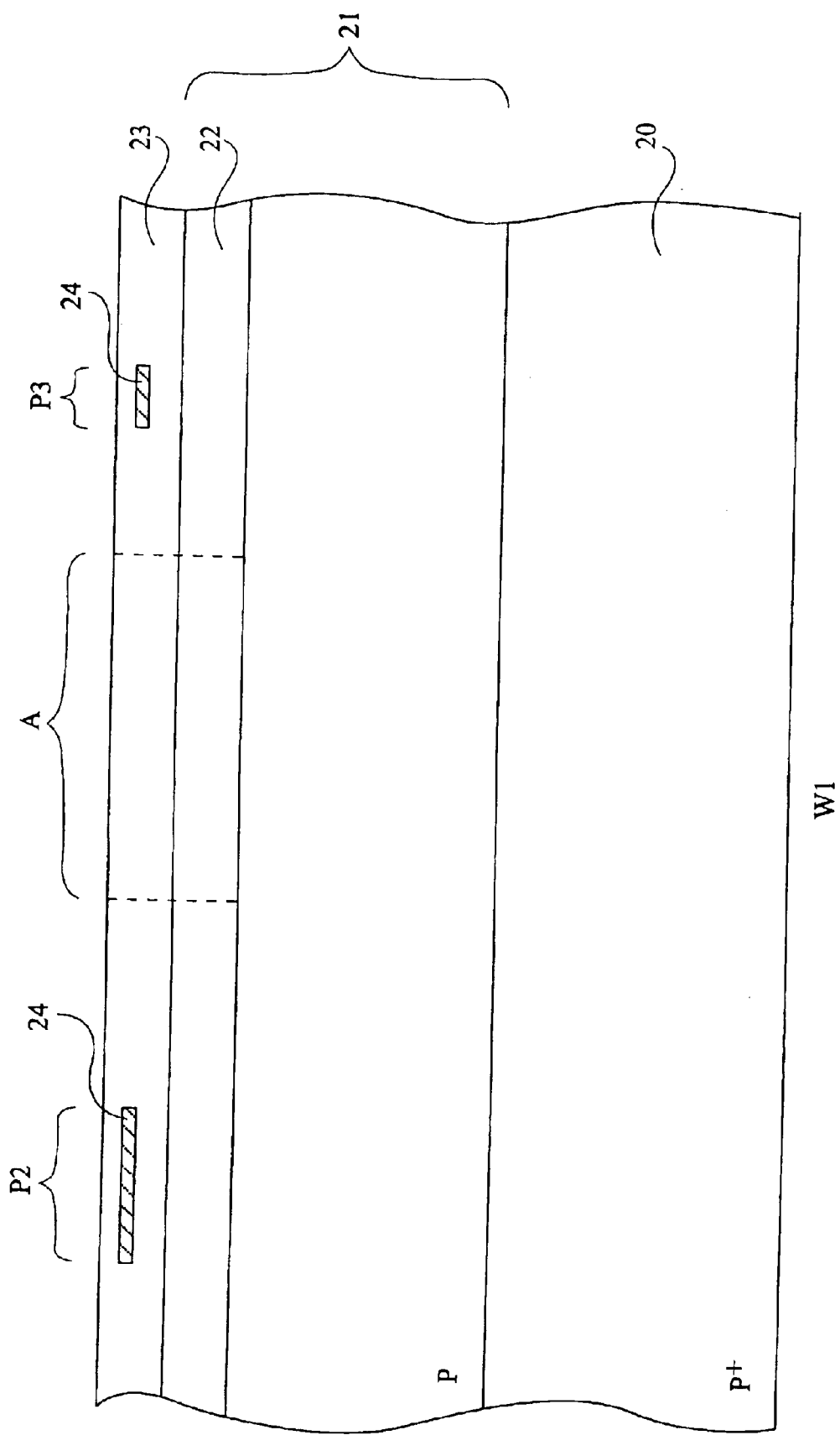

FIG. 3 shows, according to an embodiment of the present invention, a silicon wafer W1 from which chips D1 will be formed. This silicon wafer has a standard 725-$\mu$m thickness for a wafer with a 200-mm diameter. This silicon wafer has, across its thickness, two layers. First layer 20 is formed, for example, of P+-type silicon, heavily-doped with boron and has a resistivity lower than 0.1 ohm.cm. Second layer 21 is obtained by P-type silicon epitaxy. The thickness of this layer is close to the thickness of chips D2, its resistivity is 20 ohms.cm. Active and passive components are formed in upper portion 22 of layer 21. Several aluminum interconnection levels are then formed at the wafer surface, in a layer 23. The last metal level 24 includes pads P2 having, for example, a 80×80-$\mu m^2$ surface area, and pads P3 having, for example, a 10×10-$\mu m^2$ surface area. At least one area A free from any component and having an upper surface area of 500×500 $\mu m^2$ is saved in each chip D1 thus formed.

Figure 4:
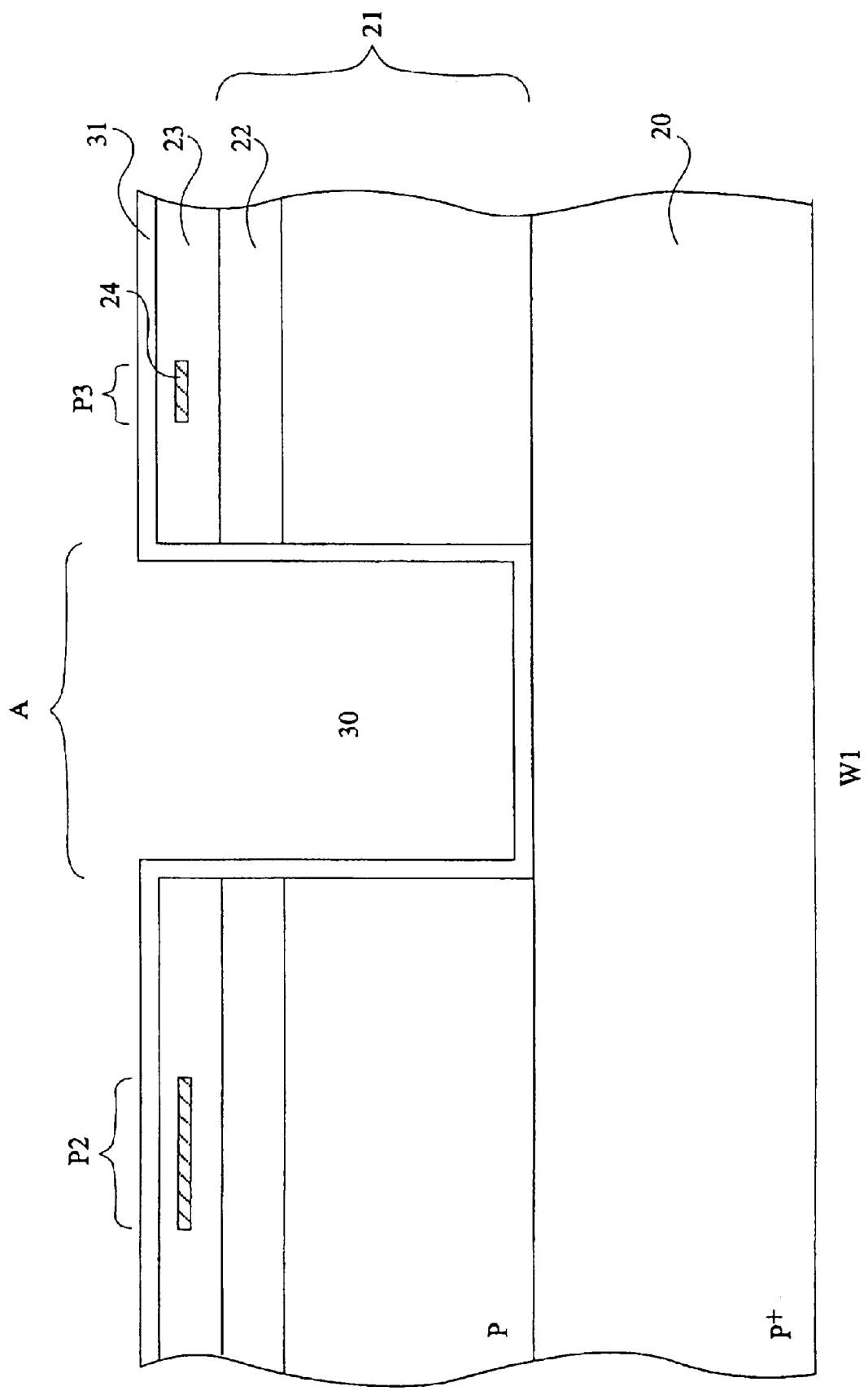

FIG. 4 illustrates the next step of the disclosed embodiment of the present invention. A cavity 30 is dug, through successive layers 23, 22, and 21 in each chip D1 of silicon wafer W1. This cavity is centered on area A and is located inside of said area. This cavity is etched by using standard photolithography means and plasmas based on halogenated compounds. According to the compositions of the gases and to the etch conditions, it is possible to start the etching anisotropically to keep the initial mask dimension. A change in the etch method optimizes the etch speed to quickly arrive close to P+-type layer 20. A last change in the etch method enables stopping the etching by using the etch selectivity between P silicon and P+ silicon. The depth of cavities 30 is determined by the reproducible thickness of layer 21. This mode of forming cavities 30 enables adjusting, with precision, the surface dimensions and the depth of these cavities to the dimensions of chips D2. After removal of the mask and cleaning, a barrier layer 31 is deposited. This layer is, for example, silicon nitride of a 0.1-$\mu$m thickness.

Figure 5:
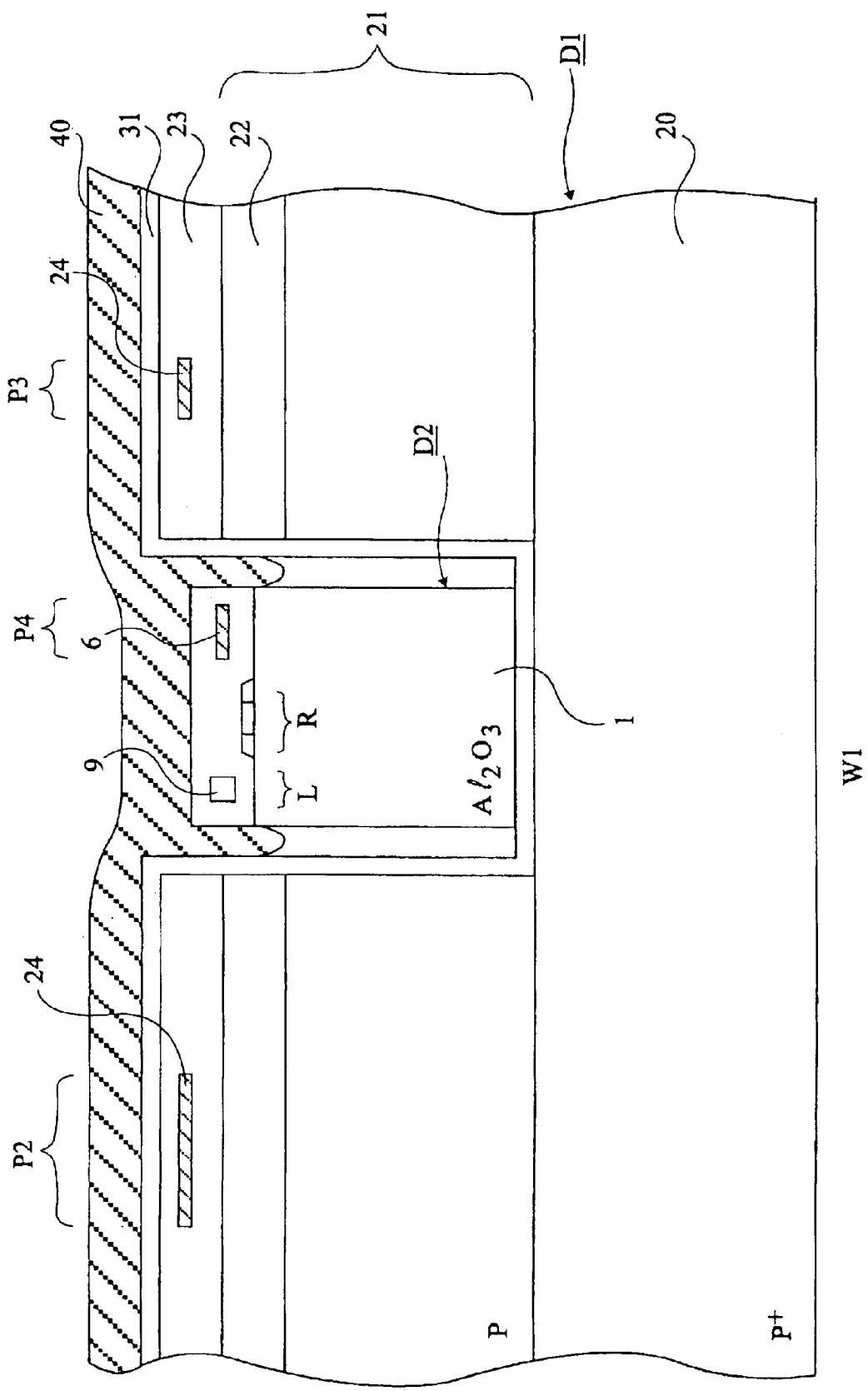

As illustrated in FIG. 5, a chip D2 is inserted into an opening A of a chip D1, while the silicon wafer has not yet been cut up in individual chips. According to an embodiment of the present invention, an insulating layer 40 is deposited. It is formed, for example, by three depositions. The first deposition is an oxide deposited by chemical vapor deposition (CVD). This first deposition of, for example, a thickness of 1 $\mu$m ensures the mechanical hold of chips D2. A second spin-on glass (SOG) deposition generates a planar surface and fills the residual cavities. This second deposition has, for example, a thickness of 5 micrometers. A third oxide or nitride deposition (of CVD type) protects the surface. This third deposition has, for example, a 0.2-$\mu$m thickness. Layer 31 insulates the circuits of wafer W1 from the possible pollutants brought by chip D2. A small step, smaller than from 1 $\mu$m to 10 $\mu$m, may remain between the surface of electronic chips D2 and the surface of wafer W1.

Figure 6:
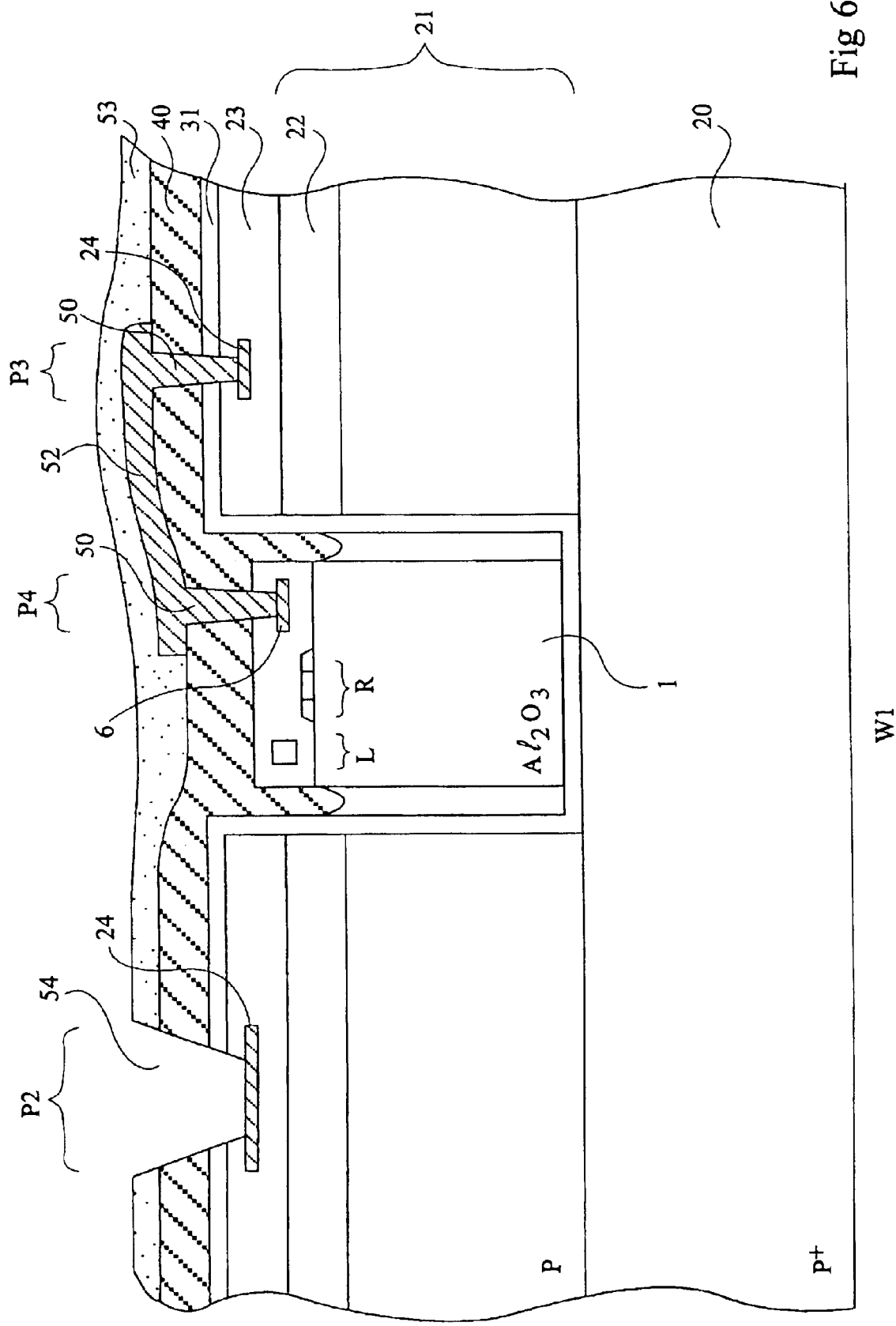

FIG. 6 shows wafer W1 after forming of connections. Contact holes 50 emerge on pads P3 and P4. The size of pads P3 and P4 and the sizes of the contact holes take into account the imprecision of the alignment of the surfaces of the two chips and the imprecision of the position of chip D2 in cavity 30. For example, pads having a 10-$\mu$m side will be used in a submicronic manufacturing method. An aluminum metal level 52 is deposited and etched. An oxide and nitride protection layer 53 is deposited over the entire wafer. This protection layer is etched above interconnection pads P2.

After cutting up wafer W1, chips D are obtained, each of which is formed of one or several chips D2 set into a chip D1. Interconnection pads P2 are the conventional pads of a manufacturing method implemented by using bulk silicon, although chip D includes a copper level and an SOS substrate.

Of course, the present invention is likely to have various alterations, modifications, and improvements which will readily occur to those skilled in the art.

Any type of system with integrable elementary units is within the scope of the present invention. The units may have electronic functions such as digital, analog, storage signal processing, sensor, detector functions. Mechanical functions are also well adapted to the present invention; accelerometers, pressure sensors are examples. Optical functions, such as laser generation and detection, may, once integrated, make use of the present invention. Finally, thermal functions such as those implemented in a Pelletier cell may also make use of the present invention.

The types of substrate simultaneously usable in the same chip only depend on the functions to be implemented. The following material can in particular be used as substrates: silicon, gallium arsenide, germanium, sapphire, zirconia, silicon carbide, ferromagnetic materials. The physical properties of the original substrate given as an example hereabove (thickness, wafer diameter) are by way of example only and do not limit the present invention.

The number of cavities 30 is not limited. These cavities may be created at various times in the manufacturing process of first chip D1. The cavities may receive chips of type D2 formed with different substrates. The cavities may receive chips of type D2 including different circuits.

In an embodiment of the present invention, it is provided to use a silicon-on-sapphire substrate. All devices and interconnections available with this type of substrate are directly usable in the case of the described embodiment. Thus, all types of transistors may be formed on chip D2: MOS, JFET, bipolar.

Any passive element is capable of being used in the present invention: metallic resistors, capacitors using contaminating conductors or dielectric, inductances including a core of a metallic material.

Figure 7:
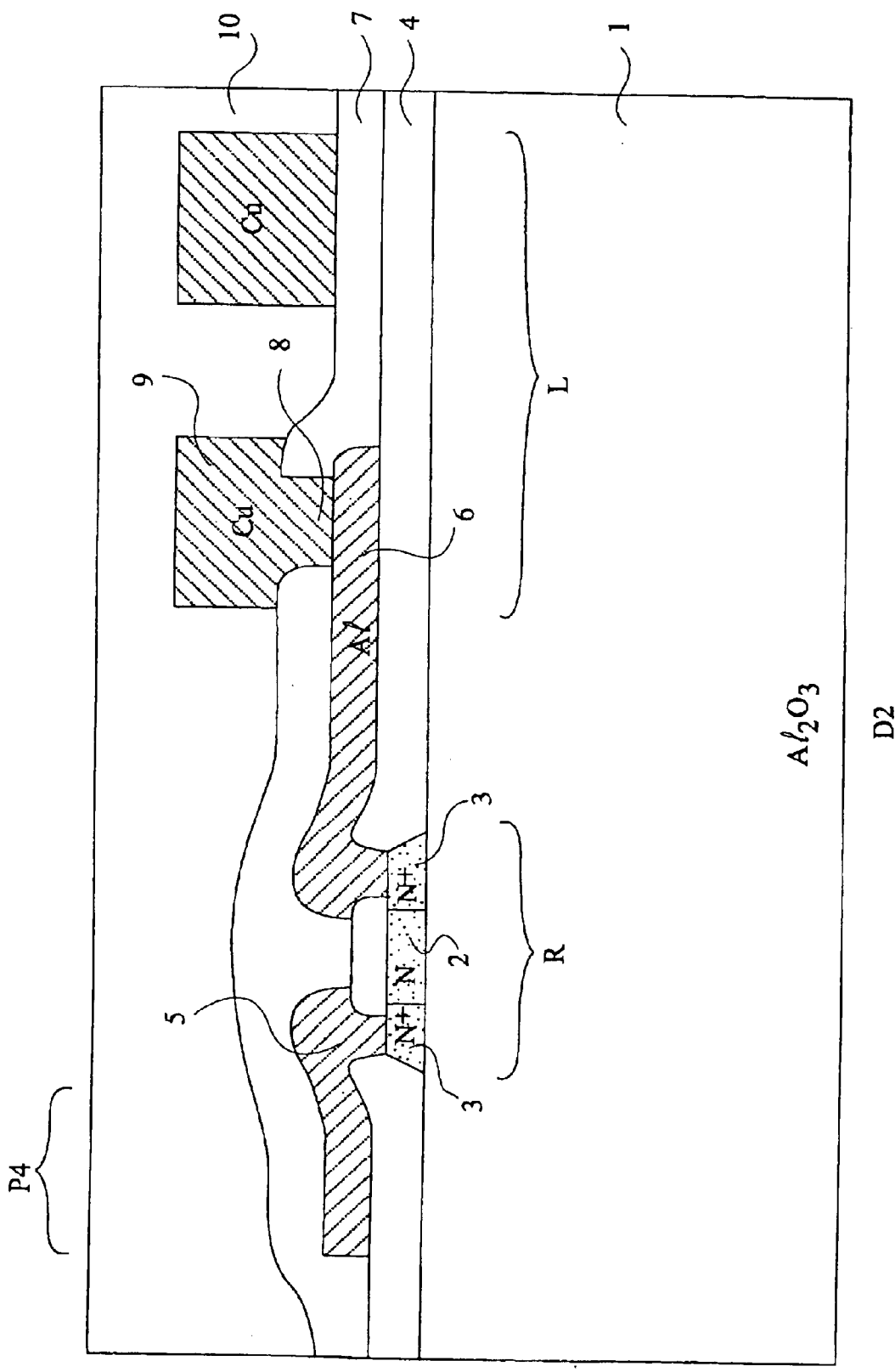
FIG. 7 shows, according to an embodiment of the present invention, a chip formed in silicon-on-sapphire technology and including one resistor and one inductance.

In an embodiment of the present invention, a massive silicon substrate is used as the first substrate type and a silicon-on-sapphire substrate (SOS) is used as the second substrate type. A manufacturing method using an SOS substrate enables forming components optimized for operation at radiofrequencies. FIG. 7 shows a specific example of a chip D2. This chip uses a single-crystal sapphire 1 (crystallized $Al_2O_3$). The thickness of this single-crystal ranges between 50 and 300 $\mu$m.

A single-crystal silicon resistor R is shown on the left-hand portion of FIG. 7. A copper inductance L is shown on the right-hand portion of FIG. 7. The two components are seen in cross-section. A thin single-crystal silicon layer is formed by epitaxy on the single-crystal sapphire 1. The thickness of this layer approximately is 0.5 $\mu$m. By using photolithography steps and ion implantation techniques, silicon strips including at each end heavily-doped contact heads 3 separated by a lightly-doped bulk 2 of the same conductivity type are formed. The value of the resistance obtained between the two contact heads depends on the conditions used for the implantations. For example, for area 2, phosphorus is implanted to obtain a concentration of $10^{19}$ at./cm$^3$ and, for area 3, arsenic is implanted to obtain a concentration of $10^{21}$ at./cm$^3$.

A first insulating layer 4 in which contact openings 5 are etched is deposited. A first metal layer 6 in an aluminum alloy is deposited and etched. This first interconnection level has three functions:

connecting devices formed in the single-crystal silicon;
forming pads P4 with a surface of approximately 10×10 $\mu$m2, to then connect chips D2 to chips D1; and
connecting elements which will be formed in the next metal level.

A second insulating layer 7 is then deposited. In the continuation of the process, contact openings 8 are defined through insulator 7. A copper metal level 9, deposited afterwards, is spiral-shaped to favor the self inductance of the deposited conductor. The connections of the inductance thus formed with the other components of chip D2 are performed through contact openings 8 by means of metal level 6.

A third insulating layer 10 is deposited. It enables protection of chips D2 and in particular of copper 9, which will never again be exposed in the manufacturing process.

The embodiment described in FIG. 7 only includes two interconnection levels, the second being contaminating and non-usable for connection with the other elements of chip D. It is possible to use any number of interconnection levels, each of these levels having specific features to be specifically processed.

The dimensions mentioned for cavities 30, pads P2, P3, P4, have been given as an example only and depend on the techniques used.

The control of the depth of cavities 30 is important since the possibility of forming, at the end of the process, a metal interconnection level defined by photolithography partly depends on it. The described embodiment provides a heterogeneous original substrate including two distinct layers 20 and 21. The selectivity of a plasma etching of layer 21 with respect to layer 20 enables stopping the etching of cavities 30 at the interface of layers 20 and 21.

As described in relation with FIG. 5, the mechanical anchoring chip D2 in chip D1 may be obtained by means of a glass deposition. Any other welding or gluing method is possible and depends on the materials used. In FIG. 5, the surface of wafer W1 is made planar by spun-on glass (SOG) deposition. Other mineral or organic depositions provide the same result. This deposition should be compatible with the subsequent interconnection levels.

A single interconnection level has been described to connect the second chips to the first chip (FIG. 6). The number and the types of metal levels used after setting of chips D2 is not limited.

Finally, chips D2 may be, like chips D1, formed on a bulk silicon substrate and then have the advantage of enabling selection of the optimized dopings, performing specific thermal cycles and/or being isolated from the components of chips D1.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An electronic chip formed of at least one second elementary chip set in a first elementary chip so that the surfaces of the elementary chips are substantially in the same plane, wherein:

the first elementary chip is formed of a heterogeneous substrate including a surface layer above a layer of different doping and defining at least one cavity extending the entire thickness of the surface layer; and at least one metal interconnection level formed over the first and second elementary chips that connects said at least one second elementary chip to the first elementary chip.

2. The electronic chip of claim 1, wherein the first elementary chip or said at least one second elementary chip includes at least one pad of dimensions at least equal to 10 μm, used as a contact surface for the at least one metal interconnection level connecting the first elementary chip to said at least one second elementary chip.

3. The electronic chip of claim 1, wherein one of the elementary chips includes a contaminating material connected to the other elements of the elementary chip only through one or more metal interconnection levels formed below a level comprising the contaminating material.

4. The electronic chip of claim 1, wherein the second elementary chip comprises passive elements.

5. The electronic chip of claim 4, wherein the second elementary chip comprises at least one inductor made of copper.

6. The electronic chip of claim 4, wherein the second elementary chip comprises at least one monocrystalline silicon resistor on a sapphire substrate.

7. A first chip configured to accommodate a second chip of known dimensions, the first chip comprising:

a first layer substantially unresponsive to a first etch process;

a second layer disposed above the first layer and responsive to the first etch process; and a cavity formed in the second layer and sized to accommodate a second chip of said known dimensions;

further comprising a barrier layer separating the first chip from the second chip.

8. The first chip of claim 7, wherein the cavity traverses the entire second layer.

9. A compound chip, comprising:

a first chip comprising a first layer substantially unresponsive to a first etch process, a second layer disposed above the first layer and responsive to the first etch process, and a cavity formed in the second layer; and a second chip disposed within the cavity formed in the first chip;

further comprising a barrier layer separating the first chip from the second chip.

10. The compound chip of claim 9, wherein the cavity traverses the entire second layer.

11. The compound chip of either of claims 9 or 10, wherein a surface of the first chip is substantially coplanar with a surface of the second chip.

12. The compound chip of claim 9, wherein the first layer is formed of P+ type silicon and the second layer is formed of P type silicon.

13. The compound chip of claim 9, wherein the first chip comprises a first substrate, and the second chip comprises a second substrate having a type different from the first substrate.

14. The compound chip of claim 10, wherein the second substrate is a sapphire substrate.

15. The compound chip of claim 10, wherein the second chip comprises passive RF elements.

16. The compound chip of claim 9, further comprising:

an insulating layer disposed above the first chip and the second chip.

17. The compound chip of claim 16, further comprising:

at least one conductive interconnection between the first chip and the second chip.

18. The compound chip of claim 17, wherein the at least one conductive interconnection includes a conductive layer disposed above the insulating layer and conductive contacts traversing the insulating layer, the conductive contacts being coupled to the conductive layer and the first and second chips.

19. The compound chip of claim 17, wherein the at least one conductive interconnection is formed of aluminum.

20. The compound chip of claim 9, further comprising:

a third chip disposed within a second cavity formed in the first chip.

21. A composite electronic chip comprising at least one second elementary chip set into a first elementary chip so that the surfaces of the elementary chips are substantially in the same plane, wherein:

the first elementary chip is formed of a heterogeneous substrate including a surface layer above a layer of different doping and defining at least one cavity extending into the substrate substantially the entire thickness of the surface layer and the surface layer being sufficiently thick that when said second elementary chip is set into said cavity, the surfaces of the elementary chips are substantially in the same plane; and at least one metal interconnection level formed over the first and second elementary chips that connects said at least one a second elementary chip to the first elementary chip.

22. The composite electronic chip of claim 21, wherein the first elementary chip or said at least one second elementary chip includes as least one pad of dimensions at least equal to 10 μm, used as a contact surface for the at least one metal interconnection level connecting the first elementary chip to said at least one second elementary chip.

23. The composite electronic chip of claim 21, wherein one of the elementary chips includes a contaminating material connected to the other elements of the elementary chip only through one or more metal interconnection levels formed below a level comprising the contaminating material.

24. The composite electronic chip of claim 21, wherein the second elementary chip comprises at least one passive element.

25. The composite electronic chip of claim 24, wherein the at least one passive element is at least one inductor made of copper.

26. The composite electronic chip of claim 24, wherein the at least one passive element is at least one monocrystalline silicon resistor on a sapphire substrate.

* * * * *